(12) United States Patent
Lepine et al.

(10) Patent No.: US 7,977,934 B2
(45) Date of Patent: Jul. 12, 2011

(54) HIGH BANDWIDTH OPEN-LOOP CURRENT SENSOR

(75) Inventors: Gerard Lepine, Peillonnex (FR); Vinh Tho Vo, Meyrin (CH)

(73) Assignee: Liaisons Electroniques-Mechaniques LEM S.A., Plan-les-Ouates (CH)

( * ) Notice: Subject to any disclaimer, the term of this patent is extended or adjusted under 35 U.S.C. 154(b) by 0 days.

(21) Appl. No.: 12/529,287

(22) PCT Filed: Feb. 22, 2008

(86) PCT No.: PCT/IB2008/000487
§ 371 (c)(1),
(2), (4) Date: Aug. 31, 2009

(87) PCT Pub. No.: WO2008/107773
PCT Pub. Date: Sep. 12, 2008

(65) Prior Publication Data
US 2010/0097049 A1 Apr. 22, 2010

(30) Foreign Application Priority Data
Mar. 2, 2007 (EP) .................................... 07405068

(51) Int. Cl.
*G01R 15/20* (2006.01)
(52) U.S. Cl. ................................ 324/117 H; 324/117 R
(58) Field of Classification Search .................. None
See application file for complete search history.

(56) References Cited

U.S. PATENT DOCUMENTS

| | | | |
|---|---|---|---|
| 4,901,008 A * | 2/1990 | Quastel et al. ............. | 324/117 H |
| 4,961,049 A | 10/1990 | Ghislanzoni | |
| 5,416,407 A * | 5/1995 | Drafts ...................... | 324/117 H |
| 5,923,162 A * | 7/1999 | Drafts et al. .............. | 324/117 H |
| 6,426,617 B1 * | 7/2002 | Haensgen et al. ........ | 324/117 H |
| 7,106,046 B2 * | 9/2006 | Nagano et al. ............ | 324/117 H |
| 2003/0112000 A1 | 6/2003 | Sorenson Jr | |
| 2005/0237049 A1 * | 10/2005 | Ozaki et al. .............. | 324/117 H |
| 2006/0176047 A1 | 8/2006 | Lepine et al. | |
| 2006/0255793 A1 * | 11/2006 | Montreuil ................. | 324/117 R |

FOREIGN PATENT DOCUMENTS

| | | |
|---|---|---|
| DE | 102 40 241 A1 | 3/2004 |
| JP | 59 007269 A | 1/1984 |
| WO | WO 01/86309 A | 11/2001 |
| WO | WO 2006/131468 A | 12/2006 |

OTHER PUBLICATIONS

International Search Report and Written Opinion for PCT/IB2008/00487 issued by the European Patent Office on Jul. 14, 2008.

* cited by examiner

*Primary Examiner* — Ha Tran T Nguyen
*Assistant Examiner* — Arleen M Vazquez
(74) *Attorney, Agent, or Firm* — Baker & Daniels LLP

(57) ABSTRACT

Open-loop electrical current sensor (1) for measuring the electrical current flowing in a primary conductor, comprising a magnetic circuit (3) with an air-gap (4), and a magnetic field sensing device (5) positioned at least partially in said air-gap. The magnetic field sensing device comprises a circuit board (7), a first magnetic field detector (8) mounted on the circuit board, and a second magnetic field detector (11). The second magnetic field detector comprises a conductive coil formed on the circuit board, the output signals of the first magnetic field detector and the second magnetic field detector being adapted for connection to a signal processing circuit (6) generating an output signal representative of the primary electrical current.

14 Claims, 3 Drawing Sheets

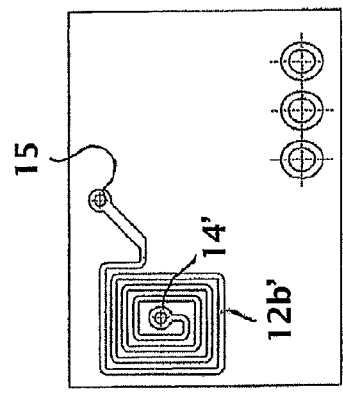
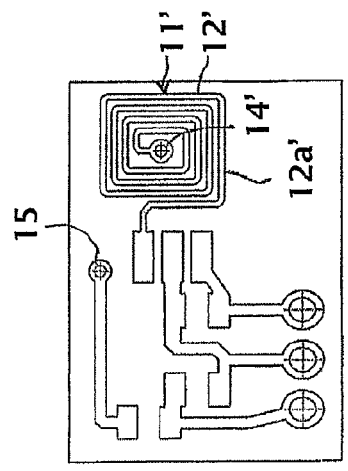
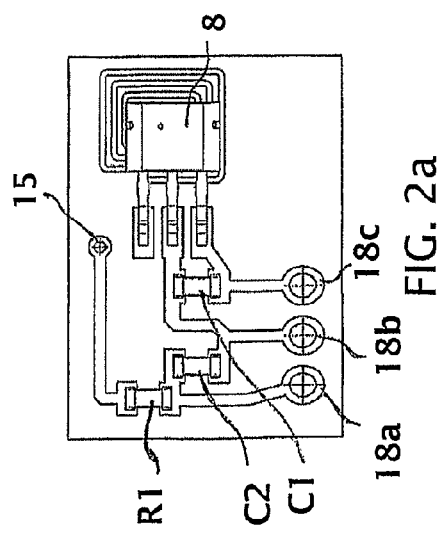
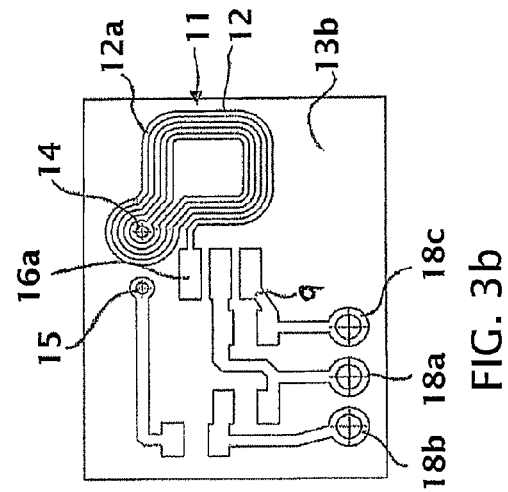
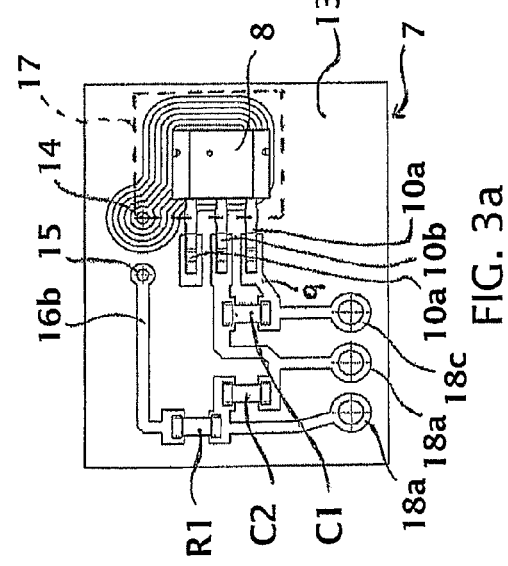

HIGH BANDWIDTH OPEN-LOOP CURRENT SENSOR

The present invention relates to an open-loop current sensor.

Open-loop current sensors are widely used for measuring electrical current flowing in a primary conductor. Such sensors typically comprise a magnetic core surrounding the primary conductor, comprising an air-gap in which a magnetic field detector is positioned.

The magnetic field detector may be a Hall effect sensor, a magneto-resistive magnetic field sensor, a fluxgate sensor or other types of magnetic field sensors.

Conventional open-loop current sensors for the measurement of an electrical current flowing in a primary conductor, usually have a magnetic circuit made of a magnetic conducting material, adapted to surround the primary conductor, and a magnetic field sensor positioned in an air-gap of the magnetic circuit, that generates an output signal representative of the primary current. A commonly used magnetic field detector is a Hall effect sensor provided in an ASIC. The magnetic flux created by the primary current is concentrated in the magnetic circuit, whereby a magnetic induction B in the air-gap is proportional to the primary current.

The Hall cell furnishes a voltage proportional to the magnetic induction in the air-gap, and thus proportional to the primary current. The voltage of the Hall cell is processed and amplified before being supplied as an output of the current sensor.

Compared to a closed-loop current sensor which comprises a compensation coil that is driven to cancel the magnetic field generated by the primary current, open-loop sensors have the advantage of requiring a simpler electronic signal processing circuit and less power, in a compact arrangement. Open-loop sensors generally have a lower cost than closed loop sensors.

A drawback of open-loop sensors however is the slow signal response time. This limits the range of frequencies such sensors can be used for, although the operating frequency range depends somewhat on the performance of the signal processing circuit and the quality of the magnetic circuit.

The signal delay caused by the magnetic circuit depends on the materials used and the construction of the circuit. Eddy currents oppose the variation of magnetic flux thus causing a delay in the magnetic induction appearing in the air-gap. The ferromagnetic materials (iron silicon, iron nickel) often used for magnetic circuits built of stacked laminations, are relatively good electrical conductors thus providing little resistance to eddy currents. Ferrite materials have the advantage of reducing eddy currents in view of their low electrical conductivity, but saturate rapidly and have a high remanence.

Delays in the output signal may also occur in the electronic circuits for processing the signal and due to Eddy currents in the lead frame on which the integrated circuit (ASIC) is mounted and connected to.

In summary, open-loop sensors are widely used in view of their low cost, simple electronics and ease of operation. A drawback of open-loop sensors is the delay in the response time to a measurement signal. This delay originates from various factors, among them the eddy currents in the magnetic circuit, the delay in the magnetic field sensor and signal processing circuit, as well as eddy currents in the lead frame or other circuits or conductors connected to the magnetic field sensor. It is possible to reduce the delay time by a careful choice of materials and design of the magnetic circuit the signal processing circuit, however such measures are costly and do not achieve response times that are acceptable for certain applications.

One such application requiring current sensors with a particularly rapid response time, is in the field of electrical motors, particularly those driven by insulated gate bipolar transistors (IGBTs). A rapid response time of current sensors found in motor control circuits is especially useful for detection of motor failure, or for controlling motors with low inductances that have high current change rates (|di/dt| is large). Such sensors are used to control switches, for example that shut off the power supply during motor failure to avoid damage.

It is known to provide current sensors employing more that one magnetic field detector to generate the output signal, the detectors operating over different frequency ranges, for example a high frequency range and a low frequency range. The latter measure increases the operational frequency bandwidth of the current sensor. Typically however, the magnetic field detectors are integrated in a single component which limits the ability to easily adapt the sensor to the particular environment and parameters to be measured. Adjustment of the sensing parameters to take into account the particular application are costly, since they require a re-design of the component. Moreover, such integrated devices may not be sufficiently sensitive for accurate measurement of weak magnetic fields generated by the current to be measured or, conversely, that are limited in the magnitude of the signal to be measured. Conventional current sensors with large operating bandwidths typically have the drawback of being limited in the amplitude range of measurement with the desired precision.

In view of the aforegoing, an object of this invention is to provide an open-loop current sensor that has a rapid response time and that is economical.

It is advantageous to provide a current sensor that may be easily modified or configured for optimal operation in relation to the expected signal characteristics of a particular application.

It is advantageous to provide an electrical current sensor that has a large current amplitude measurement operating range.

It is advantageous to provide a current sensor that is compact and that employs simple signal processing circuits.

It is further advantageous to provide a current sensor that has a low power consumption, in particular for use in relation to autonomous devices.

Objects of this invention have been achieved by providing the current sensor according to claim 1.

Disclosed herein is an open-loop electrical current sensor for measuring the electrical current flowing in a primary conductor, comprising a magnetic circuit with an air-gap, and a magnetic field sensing device positioned at least partially in said air-gap, the magnetic field sensing device comprising a circuit board, a first magnetic field detector mounted on the circuit board, and a second magnetic field detector, wherein the second magnetic field detector comprises a conductive coil formed or disposed on the circuit board, the output signals of the first magnetic field detector and the second magnetic field detector being adapted for connection to a signal processing circuit generating an output signal representative of the primary electrical current.

The first magnetic field detector may advantageously be a Hall effect detector integrated in an integrated circuit chip (ASIC) that is mounted on the circuit board and connected to electrical traces on the circuit board. The circuit board may advantageously be a printed circuit board.

The second magnetic field detector in the form of a conductive coil may advantageously be formed as a conductive track or tracks on the printed circuit board. This configuration allows the coil to be easily modified at low cost in order to adapt to different applications, if necessary, while benefiting from the presence of printed circuit board also used for connection of the first magnetic field detector. In order to increase the measurement sensitivity of the second magnetic field detector, the coil may be provided on opposite sides of the printed circuit board, or on different layers of the circuit board, the coil portions on different layers being interconnected for example by a plated through-hole.

The circuit board may advantageously comprise other electrical or electronic components for signal processing or preprocessing, in particular for combining the output signals of the first and second magnetic field detectors.

Further advantageous objects and features of the invention will be apparent from the claims, description and drawings, in which:

FIG. 2a is a plan view of the circuit board of the current sensor showing the face on which the first magnetic field detector is mounted;

FIG. 2b is a plan view of the circuit board without magnetic field detector;

FIG. 2c is a plan view of the circuit board on the reverse face;

FIG. 3a is a plan view of a circuit board according to another embodiment of the invention;

FIGS. 3b and 3c are plan views of the mounting face, respectively reverse face of the second embodiment;

Figure 1:
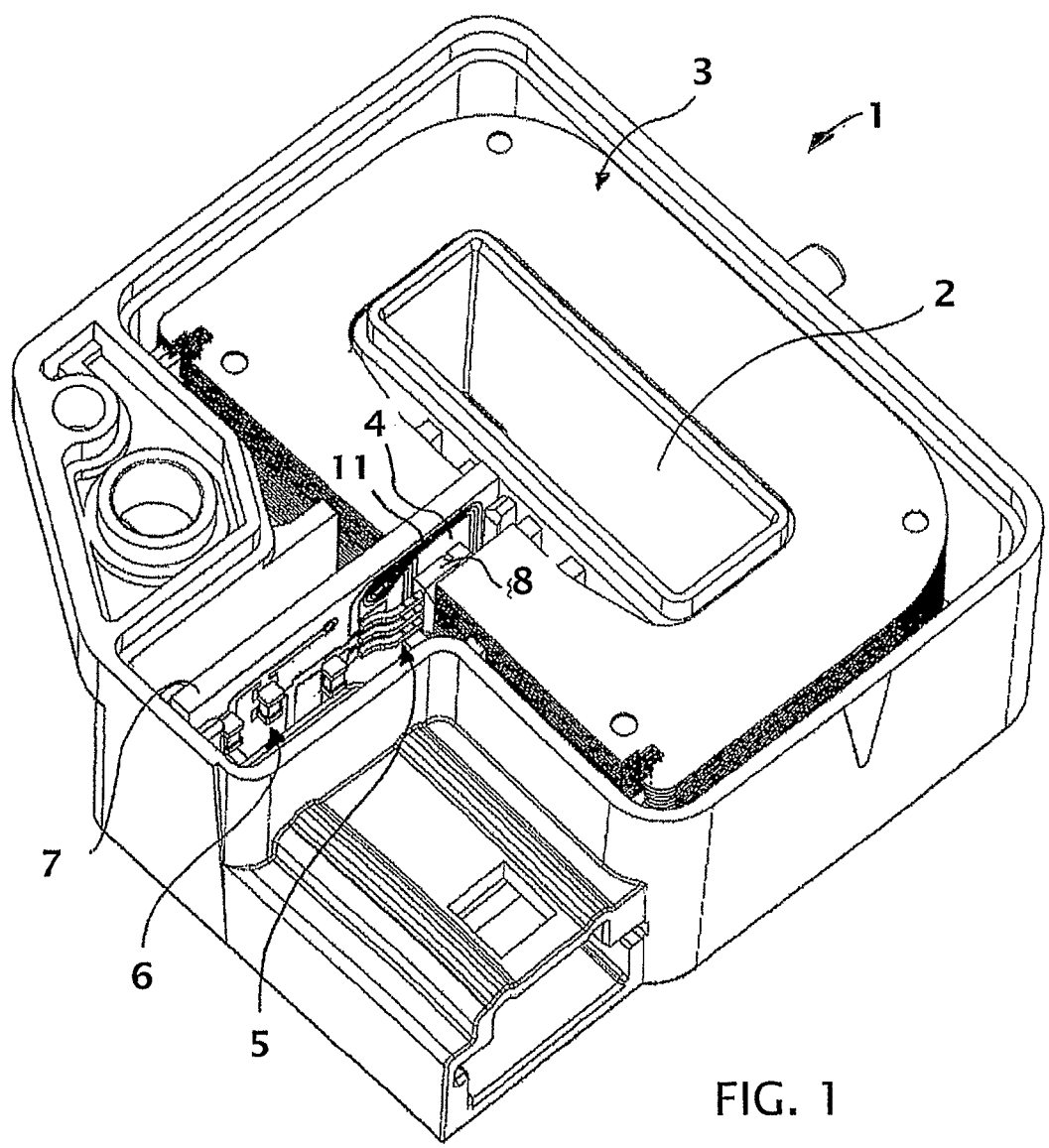
FIG. 1 is a perspective view of a current sensor according to the invention (cover removed)

Referring to the figures, in particular FIG. 1, an electrical current sensor 1 for measuring the current flowing in a primary conductor (not shown) traversing a central aperture 2 of the sensor, comprises a magnetic circuit 3 with an air-gap 4, and a magnetic field sensing device 5 positioned at least partially in the air-gap. The magnetic circuit 3 may be made of a stack of laminations, or of a solid core, of different shapes and sizes and of different magnetically conducting materials, as is known in the art. The magnetic circuit may also be split in two parts to allow assembly of the sensor around a primary conductor, as is known in the art. Further, a primary conductor portion may be integrated into the sensor and have terminals for connection to a primary conductor, as is known in the art.

The current sensor may be provided with a second air-gap and a second magnetic field sensing device positioned at least partially in said second air-gap.

The magnetic field sensing device comprises a circuit board 7, a first magnetic field detector 8 mounted on the circuit board, a second magnetic field detector 11 and a signal pre-processing circuit 6.

The signal pre-processing circuit 6 is provided on the circuit board 7 and is connected to the magnetic field detectors 8, 11.

Referring to FIGS. 2a to 2c, the first magnetic field detector 8 is, in a preferred embodiment, in the form of a Hall effect sensor included in an integrated circuit (ASIC) with connection terminals 10 connected, for example by soldering, to circuit traces 9 on the circuit board 7. The first magnetic field detector may however also comprise other types of known magnetic field sensors such as a magneto-resistive magnetic field sensor, or a fluxgate magnetic field sensor.

The second magnetic field detector 11, 11' of the magnetic sensing device, comprises a conductive coil 12, 12' formed on the circuit board as a circuit trace. The coil can thus be formed on the circuit board by means of conventional technology for producing conductive tracks on circuit boards, thus benefiting from the presence of the circuit board for connection of the first magnetic field detector and for the signal processing or preprocessing circuit 6.

In order to increase the sensitivity of the coil 12, 12' said coil may comprise more than one coil portion, each on a different surface of the circuit board. In the embodiment shown, a first coil portion 12a, 12a' is provided on a mounting face 13a and a second coil portion 12b is provided on the reverse face 13b, the second coil portion 12b being connected to the first coil portion 12a by means of a conductive plated through-hole 14. It is also possible to provide an interconnection pin or path through the board to interconnect the coil portions.

In a preferred variant, the coil portions are connected together in series.

A first extremity 16a of the coil extending from the first coil portion is directly interconnected via circuit traces on the front side 13a of the circuit board to the signal processing or preprocessing circuit 6. The second extremity 16b of the coil extending from the second coil portion 12b is electrically interconnected via a conductive plated through-hole 15 to the mounting face 13a of the circuit board.

Preferably, the coil 12 is configured such that it is positioned within the perimeter 17 defined by the faces of the magnetic circuit 3 bounding the air-gap 4. The Hall effect sensor 8 is also positioned preferably entirely within the perimeter 17.

It is possible to have additional coil portions to increase the detection sensitivity, for example on different layers of a multilayer PCB.

In the embodiment of FIGS. 2a-c, the coil 12 surrounds a central area 18 free of metallization in order to reduce eddy currents, which under certain operating conditions, may increase the delay in the signal response at high values of di/dt. The conductive interconnection 14 is situated outside of the magnetic circuit perimeter 17 for the same purpose.

In an alternative embodiment as shown in FIGS. 3a-3c, the coil portions 12a', 12b' may be interconnected by a conductively coated through-hole 14' located essentially in the center of the coil portions.

Figure 5:
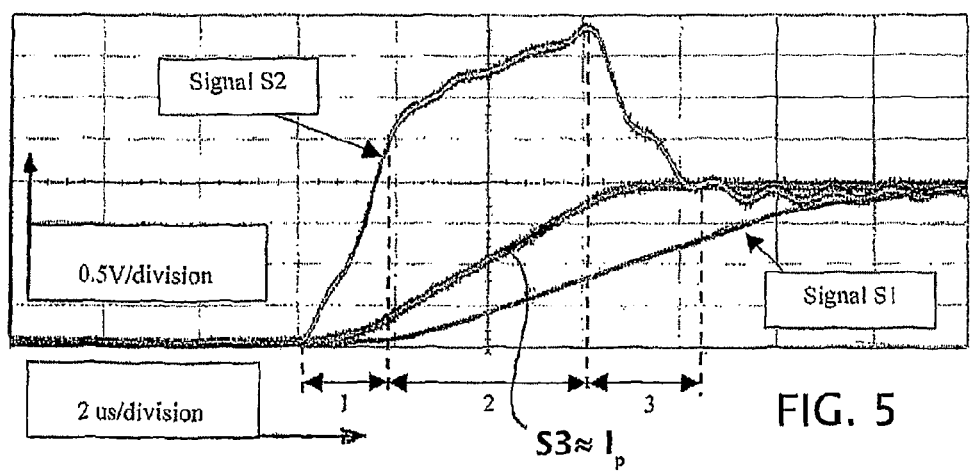
FIG. 5 is a circuit diagram of an embodiment of the current sensor according to the invention.

Referring to FIG. 5, a simplified diagram of the magnetic field sensing device and signal preprocessing circuit is illustrated. The coil 12 is connected in series to the output terminal 10a of the first magnetic field sensor 8. A filter R1, C2 is connected to the output 16b end of the coil to accord the signal of the first magnetic field sensor to the signal of the second magnet field sensor. The sensor comprises an output terminal 18b, a power supply terminal 18c at a voltage $V_{CC}$, and a ground terminal 18a.

Figure 4:
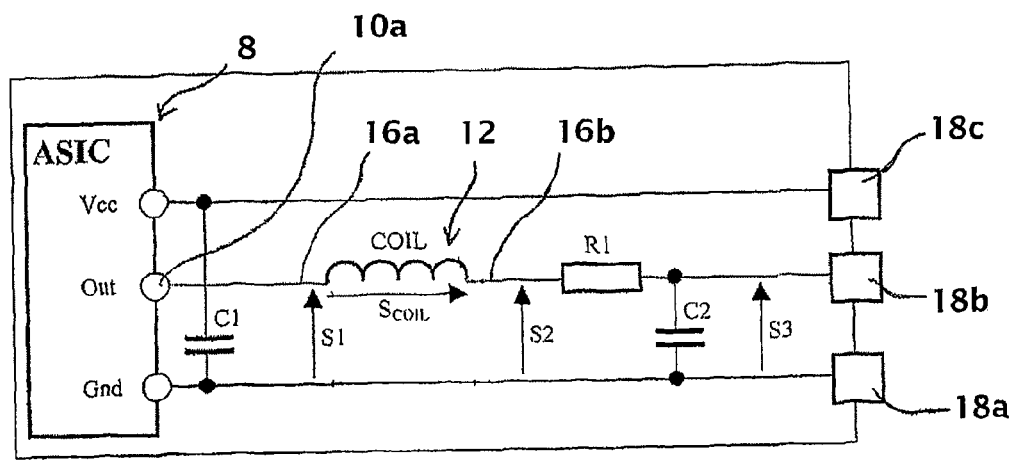
FIG. 4 is a graph illustrating the output signal of the first and second magnetic field detectors and of the input signal (the primary current to be measured)

Referring to FIG. 4, a graph illustrating the input signal generated by the primary current and the output signals of the Hall effect sensor 8 and the coil 12 is shown. Signal S1 indicates the output voltage of the Hall effect sensor which measures the magnetic induction in the air-gap of the magnetic circuit. The signal $S_{coil}$ is the voltage developed by the coil during variations of magnetic induction in the air-gap. This voltage is proportional to the electrical current in the primary conductor, the signal magnitude depending on the number of turns of the coil and the surface area of the coils.

Signal S2 is the sum of signals S1 and $S_{coil}$.

During a rapid rise in the primary current, for example a current surge following a motor failure or short circuit, the output signal of the coil may be decomposed into three characteristic phases:

during phase 1, the second derivative of the primary current is greater than zero ($d^2i/dt^2 > 0$), which means that the signal of the coil is increasing;

during phase 2, the second derivative of the primary current is essentially equal to zero ($d^2i/dt^2 \approx 0$), which means that the signal from the coil is constant;

during phase 3, the second derivative of the primary current is less than zero ($d^2i/dt^2 < 0$), whereby the signal of the coil is decreasing.

Signal S3 represents the signal S2 after filtering. The filter enables one to adapt and combine the signal $S_{coil}$ from the coil to the signal S1 from the ASIC to obtain an output signal S3 that is in phase with the primary current Ip, as shown in FIG. 6.

The output signal and the input signal from the primary current to be measured are thus substantially superposed with a response delay that is significantly inferior to one microsecond in the example shown.

The invention claimed is:

1. Open-loop electrical current sensor for measuring the electrical current flowing in a primary conductor, comprising a magnetic circuit with an air-gap, and a magnetic field sensing device comprising a circuit board, a first magnetic field detector mounted on the circuit board, and a second magnetic field detector, wherein the second magnetic field detector comprises a conductive coil formed on the circuit board, the output signals of the first magnetic field detector and the second magnetic field detector being adapted for connection to a signal processing circuit such that the output signals of the first magnetic field detector and the second magnetic field detector are added to generate an output signal representative of the primary electrical current, and wherein the first magnetic field detector and the second magnetic field detector are both positioned at least partially in said air gap.

2. Sensor according to claim 1, wherein the first magnetic field detector is a Hall effect detector integrated in an integrated circuit chip (ASIC) mounted on the circuit board and connected to electrical traces on the circuit board.

3. Sensor according to claim 1, wherein the circuit board is a printed circuit board.

4. Sensor according to claim 3, wherein the conductive coil of the second magnetic field detector is formed as a conductive track or tracks on the printed circuit board.

5. Sensor according to claim 1, wherein the coil of the second magnetic field detector comprises a plurality of coil portions each on a different layer or surface of the circuit board.

6. Sensor according to claim 5, wherein a coil portion is provided on opposite sides of the circuit board.

7. Sensor according to claim 5, wherein the coil portions are interconnected via conductive through-holes.

8. Sensor according to claim 5, wherein the coil portions are connected in series.

9. Sensor according to claim 6, wherein the coil portions are interconnected via conductive through-holes.

10. Sensor according to claim 6, wherein the coil portions are connected in series.

11. Sensor according to claim 1, further comprising a signal processing or preprocessing circuit on the circuit board for combining output signals of the first and second magnetic field detectors.

12. Sensor according to claim 1, wherein the coil of the second magnetic field detector is positioned essentially completely within a perimeter defined by faces of the magnetic circuit bounding the air gap.

13. Sensor according to claim 1, wherein the first magnetic field detector is positioned essentially completely within a perimeter defined by faces of the magnetic circuit bounding the air gap.

14. Sensor according to claim 1, wherein the second magnetic field detector is connected in series to an output of the first magnetic field detector.

* * * * *